(12) United States Patent
Sanchez et al.

(10) Patent No.: US 8,629,707 B1
(45) Date of Patent: Jan. 14, 2014

(54) AC COUPLED LEVEL SHIFTER

(71) Applicants: Hector Sanchez, Cedar Park, TX (US);
Xinghai Tang, Cedar Park, TX (US);
Gayathri A. Bhagavatheeswaran,
Austin, TX (US)

(72) Inventors: Hector Sanchez, Cedar Park, TX (US);
Xinghai Tang, Cedar Park, TX (US);
Gayathri A. Bhagavatheeswaran,
Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/690,336

(22) Filed: Nov. 30, 2012

(51) Int. Cl.
*H03L 5/00* (2006.01)

(52) U.S. Cl.
USPC .............................. 327/333; 326/80; 326/81

(58) Field of Classification Search
USPC ...................................... 327/333; 326/80, 81
See application file for complete search history.

(56) References Cited

U.S. PATENT DOCUMENTS

| | | | |
|---|---|---|---|
| 5,079,439 A * | 1/1992 | Wanlass | 327/333 |
| 6,917,239 B2 * | 7/2005 | Suzuki et al. | 327/536 |
| 7,183,817 B2 | 2/2007 | Sanchez et al. | |
| 7,224,189 B1 | 5/2007 | Ziazadeh et al. | |
| 7,671,657 B1 * | 3/2010 | Chen et al. | 327/333 |
| 7,750,718 B2 * | 7/2010 | Kim | 327/333 |
| 8,019,019 B1 | 9/2011 | Tetzlaff et al. | |

* cited by examiner

*Primary Examiner* — Kenneth B. Wells
(74) *Attorney, Agent, or Firm* — David G. Dolezal; James L. Clingan, Jr.

(57) ABSTRACT

A level shifter includes first, second and third capacitively configured transistors, first and second switching transistors, and an inverting circuit. The first capacitively configured transistor has a first terminal that receives an input signal. Second and third capacitively configured transistor each have first terminal coupled to a second terminal of the first capacitively configured transistor. The second capacitively configured transistor is coupled in series with a first switching transistor that is also coupled to a first power supply terminal. The third capacitively configured transistor is coupled in series with a second switching transistor that is also coupled to a second power supply terminal.

20 Claims, 3 Drawing Sheets

AC COUPLED LEVEL SHIFTER

BACKGROUND OF THE INVENTION

1. Field of the Invention

This invention relates in general to AC coupled level shifters.

2. Description of the Related Art

An AC coupled level shifter is a level shifter that includes a capacitive circuit in series between an input node receiving a signal from one voltage domain and a level shifted AC coupled node in another voltage domain.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, embodiments of an AC coupled level shifter include capacitively configured transistors wherein the leakage current of the capacitively configured transistors are used to correct and maintain the initial DC state of an internal AC coupled node of the level shifter.

Figure 1:
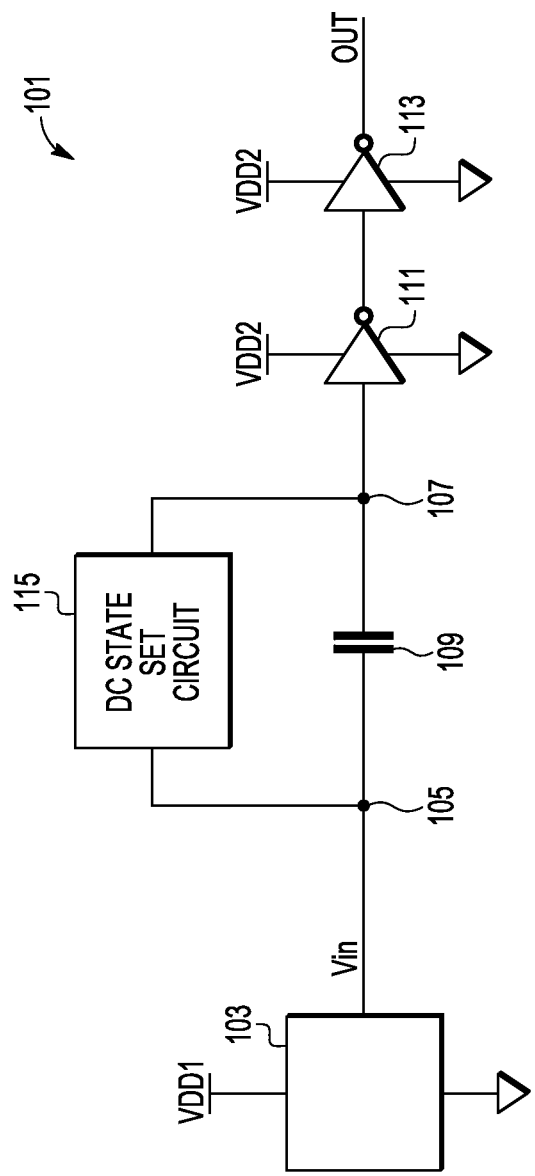
FIG. 1 is a circuit diagram of a prior art AC coupled level shifter.

FIG. 1 is a circuit diagram of a prior art level shifter. Level shifter 101 receives an input signal (Vin) at node 105 from a circuit 103 located in voltage domain VDD1. Accordingly, in some examples, signal Vin at node 105 may have a voltage swing between 0 Volts and VDD1. Level shifter 101 includes a capacitor 109 coupled in series between node 105 and AC coupled node 107. AC coupled node 107 is in voltage domain VDD2, where in one example, the voltage swing for node 107 is between 0 volts and VDD2. Level shifter 101 includes two serially coupled inverters 111 and 113 in the second voltage domain for providing a buffered output signal OUT having a DC voltage state in the VDD2 voltage domain that is determined by a voltage of signal Vin.

During the startup of level shifter 101, the DC state of node 107 may stabilize at an incorrect DC state from the DC state of node 105. For example, if node 105 is at a high DC voltage state (VDD1), node 107 may start up at a low DC voltage state (e.g. 0 volts) instead of the correct corresponding high DC voltage state VDD2. To ensure that node 107 resides in the correct DC voltage state that corresponds to the DC voltage state of node 105, level shifter 101 includes a DC state set circuit 115 that detects if there is a DC state difference between nodes 105 and 107 and places node 107 in the correct corresponding DC state if there is a state difference.

One problem with including a DC state set circuit is that it may take up space in an integrated circuit and may draw an undesirable amount of power during operation.

Figure 2:
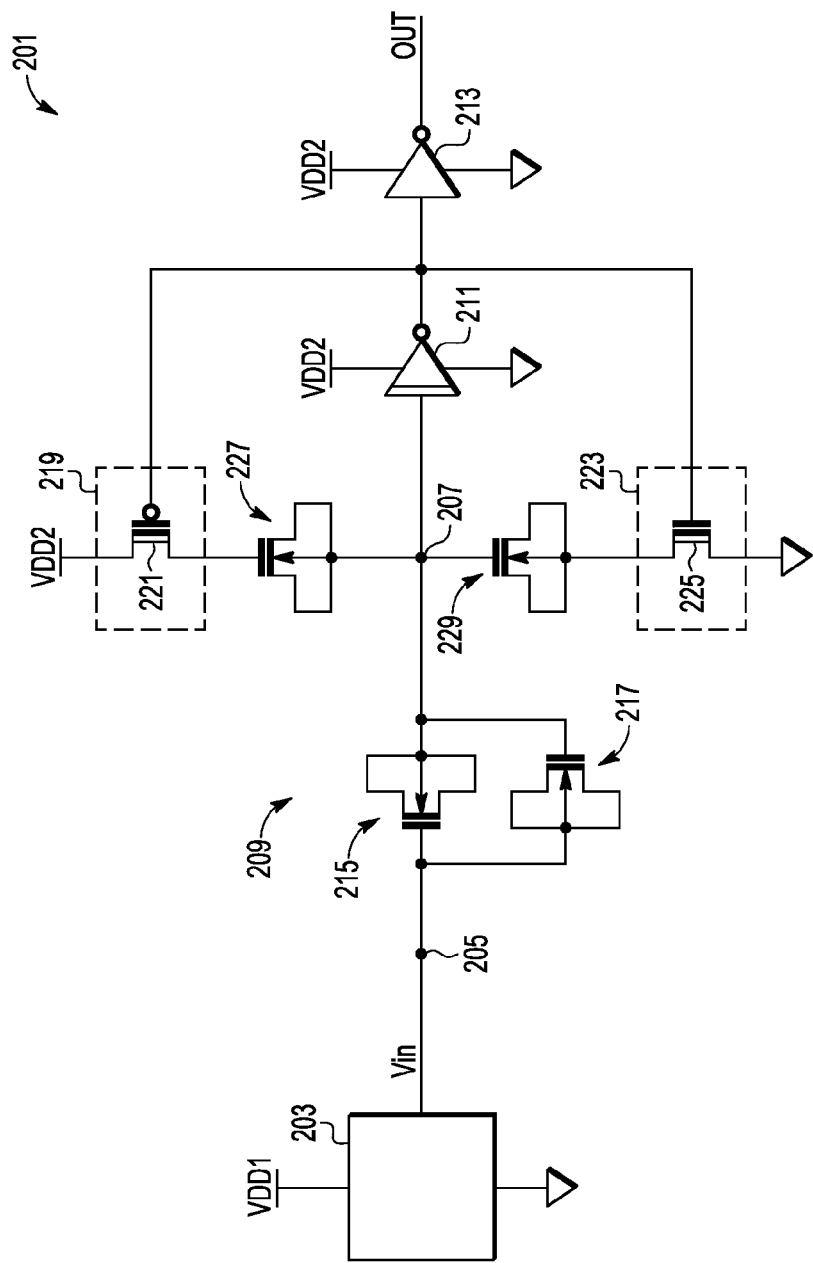
FIG. 2 is a circuit diagram of an AC coupled level shifter according to one embodiment of the present invention.

FIG. 2 is a circuit diagram of a level shifter according to one embodiment of the present invention. Level shifter 201 includes an input node 205, an AC coupled shifted node 207, and a capacitive circuit 209 coupled between input node 205 and node 207. Circuit 209 includes two capacitively configured transistors 215 and 217. A capacitively configured transistor is a transistor configured to operate as a capacitor. In the embodiment shown, each of transistors 215 and 217 is a MOSFET whose source and drain (and sometimes body) are connected together where the gate serves as one electrode and the substrate region under the gate serves as the other electrode. In the embodiment shown, capacitively configured transistors 215 and 217 are cross connected such that the gate of one transistor is coupled to the substrate of the other. Providing a pair of cross connected capacitively configured transistors provides for more uniform capacitance properties of a capacitive circuit 209 as compared to a capacitive circuit with just a single capacitively configured transistor.

Level shifter 201 includes serially connected inverters 211 and 213. The input of inverter 211 is connected to node 207 and the output inverter 213 provides an output signal OUT that is a buffered signal of node 207.

Level shifter 201 includes a capacitively configured transistor 227 connected to node 207 and coupled to a power supply terminal VDD2 via a switch circuit 219. In the embodiment shown, switch circuit 219 includes a P-channel transistor 221, but may have other configurations in other embodiments. For example switch circuit 219 may include multiple transistors connected in series or in parallel.

Level shifter 201 includes a capacitively configured transistor 229 connected to node 207 and coupled to a ground power supply terminal via a switch circuit 223. In the embodiment shown, switch circuit 223 includes an N-channel transistor 225, but may have other configurations in other embodiments. For example switch circuit 223 may include multiple transistors connected in series or in parallel.

In one embodiment, the location of the capacitively configured transistors (227 and 229) may be switched with the transistors 221 and 225.

Circuit 203 provides the input signal Vin to node 205. In one embodiment, circuit 203 is part of a Phase Lock Loop circuit where signal Vin is a reference clock signal. In one embodiment, circuit 203 is located on the same integrated circuit as level shifter 201, but may be located on a difference integrated circuit in other embodiments. In some embodiments, level shifter 201 may be used to convert a switching signal from one voltage domain to another voltage domain.

Circuit 203 is located in the voltage domain of voltage VDD1 where VDD1 is provided as the power supply voltage to circuit 203. In one embodiment, signal Vin may range from a voltage of 0 volts to VDD1. However signal Vin may be within other voltage ranges in other embodiments. Level shifter 201 provides the OUT signal in the voltage domain of VDD2. In the embodiment shown, the OUT signal may range from 0 Volts to VDD2. However, the OUT signal may be within other voltage ranges in other embodiments.

In operation, the voltage of node 207 is an AC coupled voltage that corresponds to the voltage of node 205. A logic high voltage of node 205 would correspond to a logic high voltage of node 207. Correspondingly a logic low voltage of node 205 would correspond to a logic low voltage of node 207. In one embodiment, if VDD1 is 1.5 volts and VDD2 is 1.0 volts, a voltage value of 1.5 volts of node 205 corresponds to a high voltage value near VDD2 at node 207. The voltage of the OUT signal is indicative of whether node 207 is above or below the trip voltage of inverter 211. If the voltage of node 205 is at a high DC state voltage (e.g. 1.5 volts where VDD1 equals 1.5 volts), node 207 will be at a corresponding high DC state voltage (e.g. above 0.5 voltage where VDD2 is 1.0 Volts). Node 207 being at a high voltage state causes the output of inverter 211 to be at a low voltage state (e.g. 0 Volts in the embodiment shown) which cause the OUT signal to be at the high voltage state of VDD2. Accordingly, the OUT signal is a level sifted signal of Vin.

Switch circuits 219 and 223 act to keep the voltage at node 207 stable after inverter 211 switches to the corresponding DC state. For example, if node 207 transitions to a low DC voltage state (e.g. below the trip point of inverter 211), the output of inverter 211 goes to a high voltage state which makes conductive transistor 225 and makes non conductive transistor 221. Making transistor 225 conductive pulls node 207 towards the ground voltage so that node 207 remains at the low voltage state.

If node 207 transitions to a voltage that is above the trip point of inverter 211, the output of inverter 211 is at a low voltage where transistor 221 is conductive and transistor 225 is non conductive. Transistor 221 being conductive pulls node 207 towards VDD2 so that node 207 remains at a high voltage state (e.g. near VDD2).

In order to make the DC logic state of node 207 track the DC logic state of node 205, level shifter 201 utilizes the gate to source and gate to drain leakage current from capacitively configured transistors 215, 217, 227, and 229 to "move" the voltage of node 207 from an incorrect DC logic state voltage to a correct DC logic state voltage corresponding to the DC logic state of node 205. For example, if the voltage of node 205 is at a high DC logic state (1.5V) and the voltage of node 207 is at a low DC logic state, transistor 225 is conductive and transistor 221 is non conductive. The leakage current from transistors 215 and 217 pulls node 207 towards a logic high value. When node 207 transitions above the trip point of inverter 211, the inverter 211 output goes to a low state voltage where transistor 221 becomes conductive and transistor 225 becomes non conductive. Transistor 221 becoming conductive pulls node 207 towards VDD2 to keep node 207 at a logic high voltage.

If the voltage of node 205 transitions to a low DC logic state (e.g. 0V) and the voltage of node 207 is at a high DC logic state, transistor 225 is non conductive and transistor 221 is conductive. The leakage current from transistors 215 and 217 pulls node 207 towards a logic low value. When node 207 transitions below the trip point of inverter 211, the inverter 211 output goes to a high state voltage where transistor 221 becomes non conductive and transistor 225 becomes conductive. Transistor 225 becoming conductive pulls node 207 towards ground to keep node 207 at a low logic voltage.

In the embodiment shown, the leakage current from transistors 215 and 217 is greater than the leakage current of transistor 227 or the leakage current of transistor 229. For example, when node 205 is at a high DC logic voltage and node 207 is at a low DC logic voltage where transistor 225 is conductive, the leakage current from transistor 229 would act against the leakage current from transistors 215 and 217 to pull node 207 towards ground. However, in the embodiments where the leakage current from transistor 215 and 217 is greater than the leakage current from transistor 225, the voltage of node 207 is pulled more towards the high DC state voltage of node 205 than ground. When the voltage of node 207 goes above the trip point of inverter 211, transistor 225 is made non conductive where the leakage current through transistor 229 is significantly weakened. Furthermore, when inverter 211 transitions to a high DC state to make transistor 221 conductive, the leakage current from transistor 227 helps to pull node 207 towards a high DC state voltage and maintain at that voltage. In some embodiments, transistors with different leakage currents may be produced by providing the transistors the different gate oxide thicknesses and/or different gate area sizes.

Likewise, when node 205 is at a low DC logic voltage and node 207 is at a high DC logic voltage where transistor 221 is conductive, the leakage current from transistor 227 would act against the leakage current from transistors 215 and 217 to pull node 207 towards VDD2. However, in the embodiments where the leakage current from transistor 215 and 217 is greater than the leakage current from transistor 221, the voltage of node 207 is pulled more towards the low DC state voltage of node 205 than VDD2. When the voltage of node 207 goes below the trip point of inverter 211, transistor 221 is made non conductive where the leakage current through transistor 227 is significantly weakened. Furthermore, when inverter 211 transitions to a high DC state to make transistor 225 conductive, the leakage current from transistor 229 helps to pull node 207 towards a low DC state voltage and maintain at that voltage.

Capacitively coupled transistors 227 and 229 are utilized to provide an AC coupled voltage divider with capacitive circuit 209 so as to limit the AC voltage swing of node 207 during a voltage transition of node 205. In some embodiments, limiting the voltage of node 207 during a voltage transition of node 205 ensures that the voltage of node 207 does not damage other circuitry of level shifter such as transistors 215, 217, 227, and 229, as well as transistors 221 and 225 and inverter 211 in some embodiments. In one embodiment, the size of capacitance of transistors 215, 217, 227 and 229 are dependent upon the difference in voltage between VDD1 and VDD2 in order to properly limit the voltage swing of node 207. The greater the difference in voltage, the more the voltage would need to be divided down.

However, the transistors may be configured to provide other capacitance and leakage current values in other embodiments. In one embodiment, the capacitance of each of transistors 215 and 217 is greater than the capacitance of transistor 227 or transistor 229.

Capacitively configured transistors 227 and 229 are also utilized to limit the amount of current flowing from each power terminal during a voltage transition of node 205. For example when node 205 transitions to a high state voltage and node 207 is at a low state voltage where transistor 225 is conductive, transistor 229 limits the amount of current flowing through transistor 225, thereby allowing the voltage of node 207 to be more quickly pulled towards the voltage of node 205. In one embodiment, the capacitance of transistors 215, 217, 227, and 229 substantially controls an immediate response to a change in the input signal at node 205 and the resistance of those transistors substantially controls a DC condition of node 207.

Because level shifter 201 relies on the leakage current of transistors 215, 217, 227, and 229, those transistors may be designed in some embodiments to have a relatively thinner gate dielectric that other transistors of level shifter 201 to provide for more leakage current. In the embodiment shown, transistor 221, transistor 225, and the transistors of inverter 211 are formed with a thicker gate dielectric (e.g. in as in a double gate oxide process) so as to provide for less leakage current through those devices. In the embodiment shown, inverter 213 is formed with thinner dielectric transistors so as to keep its trip point at a predesigned level.

In one embodiment, the location of the capacitively configured transistors 227 and 229 may be switched with transistors 221 and 225. Also in other embodiments, the output of inverter 213 may be used to control transistors 221 and 225, although the connectivity of transistors 221 and 225 would be switched.

Figure 3:
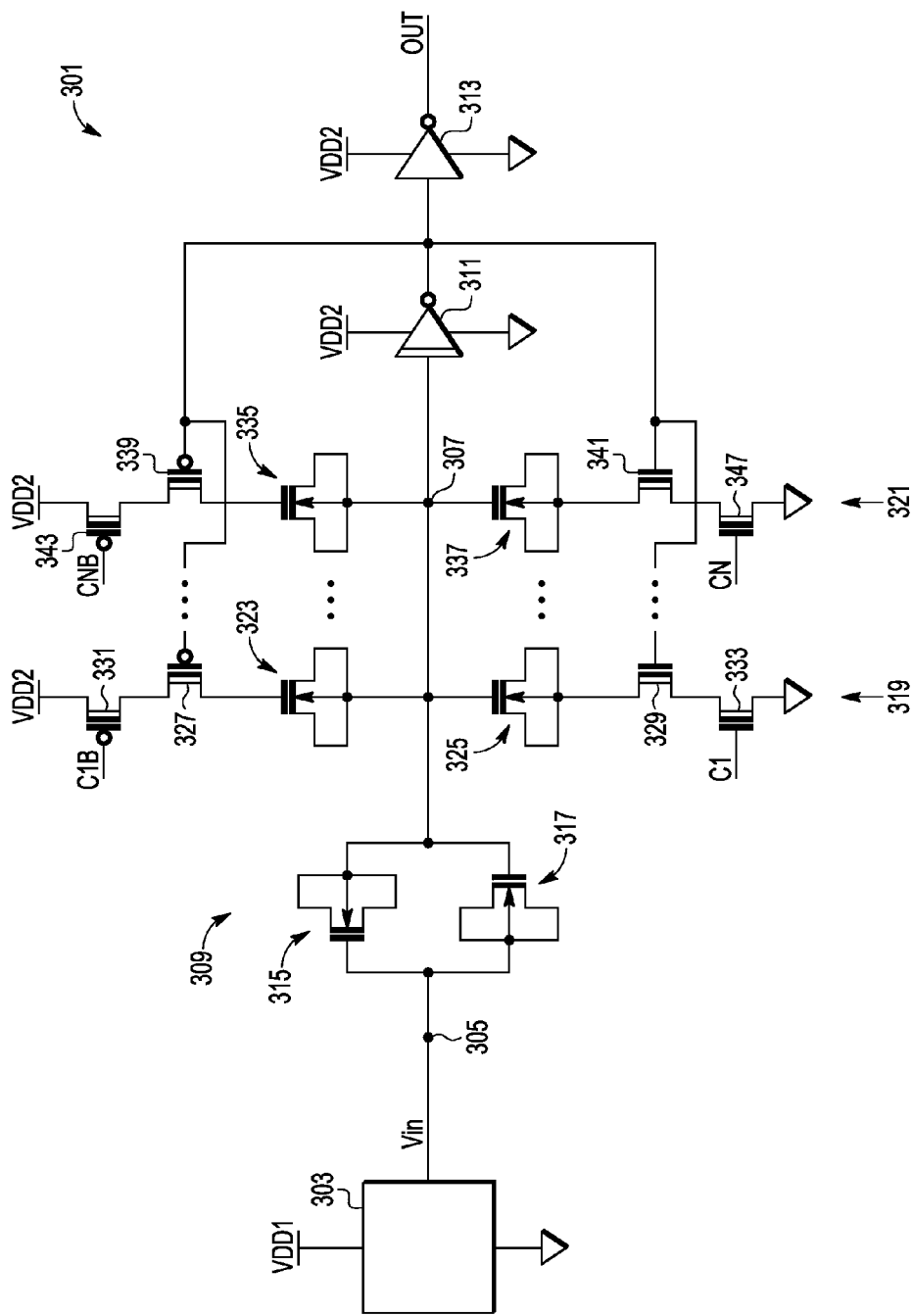
FIG. 3 is a circuit diagram of an AC coupled level shifter according to another embodiment of the present invention.

FIG. 3 is a circuit diagram of an AC coupled level shifter according to another embodiment of the present invention. Level shifter 301 is similar to level shifter 201 where capacitively configured transistors 315 and 317 of capacitive circuit 309 are similar to transistors 215 and 217 of capacitive circuit 209, and inverters 311 and 313 of level shifter 301 are similar to inverters 211 and 213 of Level Shifter 201. Node 305 is similarly coupled to circuit 303 as node 205 is coupled to circuit 203.

Level shifter 301 differs from level shifter 201 in that it is configured to provide different AC voltage divider ratios depending upon the settings of control signals (C1, C1B, CN, and CNB). For example, an AC voltage divider formed with either capacitively configured transistor 323 or capacitively configured transistor 325 and capacitively configured transistors 315 and 317 provides for a different voltage divider ratio than an AC voltage divider including capacitively configured transistor 335 or capacitively configured transistor 337 and transistors 317 and 315. These different AC voltage divider ratios may be used where the voltage difference between VDD1 and VDD2 can vary so as to set the AC voltage swing of node 307 at a desired level.

The control signals (C1, C1B, CN, and CNB) are used to control transistors 333, 331, 347, and 343, respectively, to implement the different sets of capacitively configured transistors 325, 323, 337, and 335 values to provide different AC voltage divider ratios. Control signal C1B is an inverted signal of control signal C1, and control signal CNB is an inverted signal of control signal CN. Control signals C1 and C1B are used to enable the capacitively configured transistors 325 and 323 of stack 319 and control signals CN and CNB are used to enable the capacitively configured transistors 337 and 335 of stack 321. For example, to implement transistors 323 and 325 of stack 319 in a voltage divider, the C1B signal is placed in a low logic state and the C1 is placed in a high logic state. To remove transistors 323 and 325 of stack 319 from a voltage divider, the C1B signal is placed in a high logic state and the C1 is placed in a low logic state.

In one embodiment, the capacitively coupled transistors of one stack may have different capacitive values than the capacitively configured transistors of a different stack. For example, transistor 323 may provide a different capacitive value than transistor 335. However, in other embodiments, the transistors may have the same capacitive values.

Also, although FIG. 3 shows only two stacks, other embodiments may include more stacks. In one embodiment, only one stack may be enabled at one time. However in other embodiments, multiple stacks may be enabled at the same time to provide different voltage divider ratios.

In the embodiment shown, the transistors whose gates are connected to the output of inverter 311 (e.g. 327, 339, 329 and 341) ("inverter 311 controlled transistors") are located next to the capacitively configured transistors (e.g. 323). However, the locations of the control signal transistors (e.g. 331), the inverter 311 controlled transistors (e.g. 327), and capacitively configured transistors (e.g. 323) may be interchangeably located at any of the three positions in a stack segment in other embodiments. For example, the position of the inverter 311 controlled transistors (e.g. 327) may be switched with the positions of the control signal transistors (e.g. 331) or the capacitively configured transistors (e.g. 323).

In one embodiment, level shifter 301 would include only one P-channel transistor and only one N channel transistor whose gate is connected to the output of inverter 311. The single P-channel transistor (not shown) would have a gate connected to the output of inverter 311 and would have its source connected to the VDD2 terminal. The single N-channel transistor (not shown) would have its gate connected to the output of inverter 311 would have its source connected to the ground terminal. The remaining portions of each stack (e.g. the two capacitively configured transistors and the two control signal transistors) would each be coupled in series between the drain of the single P-channel transistor and the drain of the single N-channel transistor. Hence, one inverter controlled transistor would be used to couple a power supply terminal to the multiple stages.

In one embodiment, the control signals C1, C1B, CN, and CNB are provided by a set of one time programmable devices (e.g. fuses) (not shown) that are set by the system manufacture to accommodate for the selected supply voltages VDD1 and VDD2 to be used. However, in other embodiments, the control signals may be changed during operation (e.g. by the execution of software or by control circuitry) when the power supply voltages are changed during operation.

Although the circuits shown in FIGS. 2 and 3 are implemented with MOSFETs, in other embodiments, at least some of the transistors may be implemented with other types of transistors.

A source and drain of a MOSFET are two examples of a current electrode of a transistor. A gate of a MOSFET is an example of a control electrode of a transistor. The VDD1, the VDD2 and the Ground terminal are each examples of a power supply terminal.

In one embodiment, an AC coupled level shifter includes a first capacitively configured transistor including a first terminal and a second terminal. The first terminal is for receiving an input signal from circuitry of a first voltage domain. The level shifter includes an inverting circuit including an input terminal coupled to the second terminal of the first capacitively configured transistor and including an output terminal. The inverting circuit is of a second voltage domain. The level shifter including a second capacitively configured transistor including a first terminal and a second terminal. The level shifter including a first switching transistor including a control electrode coupled to the output terminal of the inverting circuit, a first current electrode, and a second current electrode. The first switching transistor and the second capacitively configured transistor are coupled in series between the second terminal of the first capacitively configured transistor and a first power supply terminal for providing a current path between the second terminal of the first capacitively configured transistor and a first power supply terminal through the first and second current electrodes of the first switching transistor and the first and second terminals of the second capacitively configured transistor. The level shifter includes a third capacitively configured transistor including a first terminal and a second terminal. The level shifter includes a second switching transistor including a control electrode coupled to the output terminal of the inverting circuit, a first current electrode, and a second current electrode. The second switching transistor and the third capacitively configured transistor are coupled in series between the second terminal of the first capacitively configured transistor and a second power supply terminal for providing a current path between the second terminal of the first capacitively configured transistor and a second power supply terminal through the first and second current electrodes of the second switching transistor and the first and second terminals of the third capacitively configured transistor.

In another embodiment, an AC coupled level shifter includes a first capacitive element including a first terminal and a second terminal and comprising a first capacitively configured transistor. The first terminal is for receiving a signal from circuitry of a first voltage domain. The level shifter including an inverting circuit of a second voltage domain including an input and an output. The input is coupled to the second terminal of the first capacitive element. The level shifter includes a second capacitively configured transistor including a first terminal, and a second terminal. The level shifter includes a first switching transistor including a control electrode coupled to the output of the inverting circuit, a first current electrode, and a second current electrode. The first switching transistor and the second capacitively configured transistor are coupled in series between a first power supply terminal and the second terminal of the first capacitive element to provide a current path through the second capacitively configured transistor and the first switching transistor between the first power supply terminal and the second terminal of the first capacitive element. The level shifter including a third capacitively configured transistor including a first terminal and a second terminal. The level shifter including a second switching transistor including a control electrode coupled to the output of the inverting circuit, and including a first current electrode and a second current electrode. The second switching transistor and the third capacitively configured transistor are coupled in series between a second power supply terminal and the second terminal of the first capacitive element to provide a current path through the third capacitively configured transistor and the second switching transistor between the second power supply terminal and the second terminal of the first capacitive element.

In another embodiment, a method of operating an AC coupled level shifter includes receiving from circuitry of a first voltage domain, an input signal with a first capacitively configured transistor having gate leakage and providing the input signal to an input of an inverting circuit of a second voltage domain using the first capacitively configured transistor. The method includes controlling a voltage on the input of the inverting circuit using gate leakage. The gate leakage is of comprising a second capacitively configured transistor coupled to the input of the inverting circuit and selectively coupled to a first power supply terminal responsive to an output of the inverting circuit, a third capacitively configured transistor coupled to the input of the inverting circuit and selectively coupled to a second power supply terminal responsive to the output of the inverting circuit, and the first capacitively configured transistor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. An AC coupled level shifter, comprising:
a first capacitively configured transistor including a first terminal and a second terminal, the first terminal for receiving an input signal from circuitry of a first voltage domain;
an inverting circuit including an input terminal coupled to the second terminal of the first capacitively configured transistor and including an output terminal, the inverting circuit being of a second voltage domain;
a second capacitively configured transistor including a first terminal and a second terminal;
a first switching transistor including a control electrode coupled to the output terminal of the inverting circuit, a first current electrode, and a second current electrode, wherein the first switching transistor and the second capacitively configured transistor are coupled in series between the second terminal of the first capacitively configured transistor and a first power supply terminal for providing a current path between the second terminal of the first capacitively configured transistor and the first power supply terminal through the first and second current electrodes of the first switching transistor and the first and second terminals of the second capacitively configured transistor;
a third capacitively configured transistor including a first terminal and a second terminal; and
a second switching transistor including a control electrode coupled to the output terminal of the inverting circuit, a first current electrode, and a second current electrode, wherein the second switching transistor and the third capacitively configured transistor are coupled in series between the second terminal of the first capacitively configured transistor and a second power supply terminal for providing a current path between the second terminal of the first capacitively configured transistor and the second power supply terminal through the first and second current electrodes of the second switching transistor and the first and second terminals of the third capacitively configured transistor.

2. The level shifter of claim 1, wherein the first switching transistor is a P channel transistor and the second switching transistor is an N channel transistor, the first power supply terminal is for receiving a higher voltage than the second power supply terminal.

3. The level shifter of claim 1, wherein the first, second, and third capacitively configured transistors have a first gate dielectric thickness and the first switching transistor has a second gate dielectric thickness greater than the first gate dielectric thickness.

4. The level shifter of claim 1, further comprising a fourth capacitively configured transistor including a first terminal connected to the first terminal of the first capacitively configured transistor and a second terminal connected to the second terminal of the first capacitively configured transistor.

5. The level shifter of claim 4, wherein the first terminal of the first capacitively configured transistor comprises a transistor gate and the second terminal of the fourth capacitively configured transistor comprises a transistor gate.

6. The level shifter of claim 5, wherein the second terminal of the first capacitively configured transistor comprises a transistor source, drain, and body and the first terminal of the fourth capacitively configured transistor comprises a transistor source, drain, and body.

7. The level shifter of claim 1, further comprising:
a third switching transistor coupled in series with the first switching transistor and the second capacitively configured transistor so that the third switching transistor, the first switching transistor, and the second capacitively configured transistor are coupled between the second terminal of the first capacitively configured transistor and the first power supply terminal, wherein a control electrode of the third switching transistor is for receiving a first control signal;
a fourth capacitively configured transistor including a first terminal and a second terminal; and
a fourth switching transistor, the fourth switching transistor and the fourth capacitively configured transistor are coupled in series between the second terminal of the first capacitively configured transistor and the first power supply terminal for providing a current path between the second terminal of the first capacitively configured transistor and a first power supply terminal through the fourth switching transistor and the first and second terminals of the fourth capacitively configured transistor, wherein a control electrode of the fourth switching transistor is for receiving a second control signal.

8. The level shifter of claim 1, further comprising:
a second inverting circuit including an input coupled to the output terminal of inverting circuit and including an output.

9. The level shifter of claim 1, wherein:
the second terminal of the second capacitively configured transistor is a transistor gate and the first terminal of the third capacitively configured transistor is a transistor gate.

10. The level shifter of claim 1, further comprising:
a third switching transistor coupled in series with the first switching transistor so that the third switching transistor and the first switching transistor are coupled between the second terminal of the second capacitively configured transistor and the first power supply terminal, wherein a control electrode of the third switching transistor is for receiving a first control signal;
a fourth capacitively configured transistor including a first terminal and a second terminal; and
a fourth switching transistor and a fifth switching transistor, the fourth switching transistor, the fifth switching transistor and the fourth capacitively configured transistor are coupled in series between the second terminal of the first capacitively configured transistor and the first power supply terminal for providing a current path between the second terminal of the first capacitively configured transistor and a first power supply terminal through the fourth switching transistor, the fifth switching transistor, and the first and second terminals of the fourth capacitively configured transistor, wherein a control electrode of the fourth switching transistor is coupled to the output terminal of the inverting circuit and a control electrode of the fifth switching transistor is for receiving a second control signal.

11. The level shifter of claim 10, further comprising:
a sixth switching transistor coupled in series with the second switching transistor so that the sixth switching transistor and the second switching transistor are coupled between the second terminal of the second capacitively configured transistor and the second power supply terminal, wherein a control electrode of the sixth switching transistor is for receiving a third control signal;
a fifth capacitively configured transistor including a first terminal and a second terminal; and
a seventh switching transistor and an eighth switching transistor, the seventh switching transistor, the eighth switching transistor and the fifth capacitively configured transistor are coupled in series between the second terminal of the first capacitively configured transistor and the second power supply terminal for providing a current path between the second terminal of the first capacitively configured transistor and a second power supply terminal through the seventh switching transistor, the eighth switching transistor, and the first and second terminals of the fifth capacitively configured transistor, wherein a control electrode of the seventh switching transistor is coupled to the output terminal of the inverting circuit and a control electrode of the eighth switching transistor is for receiving a fourth control signal.

12. An AC coupled level shifter, comprising:
a first capacitive element including a first terminal and a second terminal and comprising a first capacitively configured transistor, wherein the first terminal is for receiving a signal from circuitry of a first voltage domain;
an inverting circuit of a second voltage domain including an input and an output, wherein the input is coupled to the second terminal of the first capacitive element;
a second capacitively configured transistor including a first terminal, and a second terminal;
a first switching transistor including a control electrode coupled to the output of the inverting circuit, a first current electrode, and a second current electrode, wherein the first switching transistor and the second capacitively configured transistor are coupled in series between a first power supply terminal and the second terminal of the first capacitive element to provide a current path through the second capacitively configured transistor and the first switching transistor between the first power supply terminal and the second terminal of the first capacitive element;
a third capacitively configured transistor including a first terminal and a second terminal; and
a second switching transistor including a control electrode coupled to the output of the inverting circuit, and including a first current electrode and a second current electrode, wherein the second switching transistor and the third capacitively configured transistor are coupled in series between a second power supply terminal and the second terminal of the first capacitive element to provide a current path through the third capacitively configured transistor and the second switching transistor between the second power supply terminal and the second terminal of the first capacitive element.

13. The level shifter of claim 12 wherein a capacitance of the first capacitive element exceeds a capacitance of the second capacitively configured transistor and exceeds a capacitance of the third capacitively configured transistor.

14. The level shifter of claim 12, wherein leakage current of the first capacitively configured transistor is greater than leakage current of the second capacitively configured transistor and leakage current of the third capacitively configured transistor.

15. The level shifter of claim 12, wherein the first capacitive element further comprises a fourth capacitively configured transistor including a first terminal and a second terminal, wherein the first terminal is connected to the first terminal of the first capacitively configured transistor and the second terminal is connected to the second terminal of the first capacitively configured transistor.

16. The level shifter of claim 15, wherein:
the first terminal of the first capacitively configured transistor comprises a transistor gate;
the second terminal of the first capacitively configured transistor comprises a source, drain, and body;
the first terminal of the fourth capacitively configured transistor comprises a source, drain, and body; and
the second terminal of the fourth capacitively configured transistor comprises a transistor gate.

17. The level shifter of claim 12, further comprising:
a third switching transistor coupled in series with the first switching transistor and the second capacitively configured transistor, wherein a control electrode of the third switching transistor is for receiving a first control signal;
a fourth capacitively configured transistor including a first terminal and a second terminal;

a fourth switching transistor, wherein the fourth switching transistor and the fourth capacitively configured transistor are coupled in series between the first power supply terminal and the second terminal of the first capacitive element to provide a current path through the fourth capacitively configured transistor and the fourth switching transistor between the first power supply terminal and the second terminal of the first capacitive element, a control electrode of the fourth switching transistor is for receiving a second control signal.

18. The level shifter of claim 12, wherein the first and third capacitively configured transistor have a gate dielectric with a thickness less than a thickness of a gate dielectric of the first switching transistor.

19. A method of operating an AC coupled level shifter, comprising:
- receiving from circuitry of a first voltage domain, an input signal with a first capacitively configured transistor having gate leakage;
- providing the input signal to an input of an inverting circuit of a second voltage domain using the first capacitively configured transistor;
- controlling a voltage on the input of the inverting circuit using gate leakage, wherein the step of using gate leakage comprises using:
  - a second capacitively configured transistor coupled to the input of the inverting circuit and selectively coupled to a first power supply terminal responsive to an output of the inverting circuit;
  - a third capacitively configured transistor coupled to the input of the inverting circuit and selectively coupled to a second power supply terminal responsive to the output of the inverting circuit; and
  - the first capacitively configured transistor.

20. The method of claim 19, wherein the controlling the voltage further comprises using gate leakage from a fourth capacitively configured transistor connected in parallel with the first capacitively configured transistor.

\* \* \* \* \*